(12) United States Patent
Mandalapu et al.

(10) Patent No.: US 11,418,282 B2
(45) Date of Patent: Aug. 16, 2022

(54) TRANSCEIVER FOR TRANSMISSION OF BMC DATA THROUGH CONFIGURABLE CHANNEL OF A USB TYPE-C PORT

(71) Applicant: SILICONCH SYSTEMS PVT LTD, Karnataka (IN)

(72) Inventors: S V Kalyani Mandalapu, Andhra Pradesh (IN); Rakesh Kumar Polasa, Karnataka (IN); Shubham Paliwal, Uttar Pradesh (IN); Satish Anand Verkila, Karnataka (IN)

(73) Assignee: SILICONCH SYSTEMS PVT LTD, Karnataka (IN)

( * ) Notice: Subject to any disclaimer, the term of this patent is extended or adjusted under 35 U.S.C. 154(b) by 0 days.

(21) Appl. No.: 17/179,255

(22) Filed: Feb. 18, 2021

(65) Prior Publication Data
US 2022/0085911 A1 Mar. 17, 2022

(30) Foreign Application Priority Data
Sep. 15, 2020 (IN) .............................. 202041039978

(51) Int. Cl.
*H04L 1/00* (2006.01)
*G05F 1/575* (2006.01)
(Continued)

(52) U.S. Cl.
CPC ............ *H04L 1/0033* (2013.01); *G05F 1/575* (2013.01); *G06F 13/4282* (2013.01);
(Continued)

(58) Field of Classification Search
CPC ..... H04L 1/0033; H04L 1/0036; G05F 1/575; H03K 5/133; H03K 2005/00058; H03M 5/12; G06F 13/4282; G06F 2213/0042
See application file for complete search history.

(56) References Cited

U.S. PATENT DOCUMENTS

| | | | |
|---|---|---|---|
| 10,057,090 B2 * | 8/2018 | Hafizi | H04L 25/03885 |
| 10,078,616 B2 * | 9/2018 | Setiawan | G06F 13/4282 |
| 10,404,271 B1 * | 9/2019 | Tao | H04B 1/0475 |

OTHER PUBLICATIONS

Universal Serial Bus Type-C Cable and Connector Specification Release 2.0, USB 3.0 Promoter Group, Aug. 2019 (373 pages).
(Continued)

*Primary Examiner* — Sophia Vlahos
(74) *Attorney, Agent, or Firm* — Procopio, Cory, Hargreaves & Savitch LLP (57) ABSTRACT

The present disclosure provides a transceiver for transmission of data coded according to a Bi-phase Mark Coding (BMC) protocol through a configurable channel (CC) of a USB type-C port. The transceiver includes: a transmitter configured to receive the coded BMC data and transmit the coded BMC data through the CC line. The transmitter includes: a low dropout (LDO) regulator configured to receive a reference voltage (VREF) and generate a local programmable supply voltage; a delay control logic configured to receive the BMC data, and including flipflops connected in series, wherein, output from each flipflop is delayed with respect to input received by the flipflop; and a transmitter driver configured to receive output from each flipflop of the delay control logic, the transmitter driver including a NMOS switches and a PMOS switches. The transceiver includes an eye correction receiver configured to receive output from the transmitter driver of the transmitter.

12 Claims, 8 Drawing Sheets

(51) Int. Cl.
*H03K 5/133* (2014.01)
*H03M 5/12* (2006.01)
*G06F 13/42* (2006.01)
*H03K 5/00* (2006.01)

(52) U.S. Cl.
CPC .............. *H03K 5/133* (2013.01); *H03M 5/12* (2013.01); *H04L 1/0002* (2013.01); *H04L 1/0036* (2013.01); *G06F 2213/0042* (2013.01); *H03K 2005/00058* (2013.01)

(56) References Cited

OTHER PUBLICATIONS

Universal Serial Bus Power Delivery Specification, Revision 3.0, Version 2.0, Aug. 29, 2019 (657 pages).

\* cited by examiner

BMC TX MASK DEFINITION, X VALUES

| Name | Description | Value | Units |
|---|---|---|---|
| X1Tx | Left Edge of Mask | 0.015 | UI |
| X2Tx | see figure | 0.07 | UI |
| X3Tx | see figure | 0.15 | UI |
| X4Tx | see figure | 0.25 | UI |
| X5Tx | see figure | 0.35 | UI |
| X6Tx | see figure | 0.43 | UI |
| X7Tx | see figure | 0.485 | UI |
| X8Tx | see figure | 0.515 | UI |
| X9Tx | see figure | 0.57 | UI |
| X10Tx | see figure | 0.65 | UI |
| X11Tx | see figure | 0.75 | UI |
| X12Tx | see figure | 0.85 | UI |
| X13Tx | see figure | 0.93 | UI |
| X14Tx | Right Edge of Mask | 0.985 | UI |

BMC TX MASK DEFINITION, Y VALUES

| Name | Description | Value | Units |
|---|---|---|---|
| Y1Tx | Lower bound of Outer Mask | -0.075 | V |
| Y2Tx | Lower bound of Inner Mask | 0.075 | V |
| Y3Tx | see figure | 0.15 | V |
| Y4Tx | see figure | 0.325 | V |
| Y5Tx | Inner mask vertical midpoint | 0.5625 | V |
| Y6Tx | see figure | 0.8 | V |
| Y7Tx | see figure | 0.975 | V |
| Y8Tx | see figure | 1.04 | V |
| Y9Tx | Upper bound of Outer Mask | 1.2 | V |

TRANSCEIVER FOR TRANSMISSION OF BMC DATA THROUGH CONFIGURABLE CHANNEL OF A USB TYPE-C PORT

CROSS REFERENCE TO RELATED APPLICATIONS

This Paris Convention Patent Application claims benefit under 35 U.S.C. § 119 and claims priority to Indian Patent Application No. IN 202041039978, filed on Sep. 15, 2020, titled "A TRANSCEIVER FOR TRANSMISSION OF BMC DATA THROUGH CONFIGURABLE CHANNEL OF A USB TYPE-C PORT", the content of which is incorporated herein in its entirety by reference for all purposes.

TECHNICAL FIELD

The present disclosure relates, in general, to data transmission through configurable channels in a Universal Serial Bus (USB) type-C port. In particular, the present disclosure relates to transmission of data through configurable channels in a USB type-C port with slew rate control and eye correction.

BACKGROUND

Background description includes information that may be useful in understanding the present invention. It is not an admission that any of the information provided herein is prior art or relevant to the presently claimed invention, or that any publication specifically or implicitly referenced is prior art.

USB-C ports offer high power delivery through the VBUS pin of the USB-C port. The voltage on VBUS is negotiated through configurable channel (CC) pins CC1 or CC2, which transmit communication data that is encoded according to a Bi-phase Mark Coding (BMC) protocol. While BMC coding of the data getting transmitted is required, USB Power Delivery (USB PD) specification puts additional constraints on the slew rate and eye formed by the bits of data under transmission.

As per specification, a transmitter is required to transmit BMC data to either of the CC1/CC2 line with slew rate control of about 300 ns and a termination impedance of about 50 ohms, so that a receiver can receive the BMC data without fault.

Present means in the art possesses limitations. One of them is that transmitter output slew rate correction is not present in order to manipulate uncertainty of parasitic parameters after post silicon to compensate for any silicon process effects.

Another limitation is that present art does not address how transmission (TX) eye parameters may be corrected while transmitting the information on CC lines.

There is, therefore, a requirement in the art for a means to transmit data coded in BMC protocol through configurable channels of a USB type-C port such that the transmission occurs as per standards.

SUMMARY

A general object of the present disclosure is to provide a means to faultlessly transmit BMC data through configurable channel of a USB type-C port.

Another object of the present disclosure is to provide a means to transmit BMC data with slew control.

Another object of the present disclosure is to provide a means to transmit BMC data with eye correction.

Another object of the present disclosure is to provide a means to transmit BMC data according to USB type-C Power Delivery (PD) specification.

The present disclosure relates, in general, to data transmission through configurable channels in a USB type-C port. In particular, the present disclosure relates to transmission of data through configurable channels in a USB type-C port with slew rate control and eye correction.

In an aspect, the present disclosure provides a transceiver for transmission of data coded according to a Bi-phase Mark Coding (BMC) protocol through a configurable channel (CC) of a USB type-C port. The transceiver includes: a transmitter configured to receive the coded BMC data and transmit the coded BMC data through the CC line. The transmitter includes: a low dropout (LDO) regulator configured to receive a reference voltage (VREF) and generate a local programmable supply voltage; a delay control logic configured to receive the BMC data, and including a plurality of flipflops connected in series, wherein, output from each flipflop is delayed with respect to input received by the flipflop; and a transmitter driver configured to receive output from each flipflop of the delay control logic, the transmitter driver including a plurality of N-type Metal Oxide Semiconductor (NMOS) switches and a plurality of P-type Metal Oxide Semiconductor (PMOS) switches. The plurality of NMOS switches and the plurality of PMOS switches are operable on receipt of output from each flipflop of the delay control logic, and the plurality of NMOS switches and the plurality of PMOS switches are turned on with delays corresponding to output from each flipflop to generate a slew rate for the output of the transmitter driver, the output being BMC data with slew control. The transceiver includes an eye correction receiver configured to receive output from the transmitter driver of the transmitter. Output from the transmitter is sent from a first CC line and received at the eye correction receiver through a second CC line to provide eye control to the transmitted BMC data.

In another embodiment, the first CC line can be any of CC1 and CC2, and the second CC line can correspondingly be any of CC2 and CC1.

In an exemplary embodiment, the output of the eye correction receiver is sampled by a digital control unit, which is configured to set the RES TRIM <0:23> that is used for slew and impedance control in the transmitter driver.

In an embodiment, the transmitter receives TX-EN and TX_CLK to be transmitted on the CC line from a digital control unit.

In another embodiment, upon assertion of TX_EN, output from each flipflop is such that there is a delay with respect to input BMC data received by respective flipflops. In an exemplary embodiment, the delay is one clock cycle.

In another embodiment, upon de-assertion of TX_EN, output of each flipflop is set to 1 and 0. In another embodiment, the output is supplied to the transmitter driver where the plurality of NMOS switches and the plurality of PMOS switches are turned off, and the output data from the transmitter is in a high impedance (Hi-Z) state.

In another embodiment, the output from the transmitter is connected to CC pin through selection multiplexer (MUX) in order to transmit data coded as per BMC protocol.

In another embodiment, the receiver is provided with a comparator-based scheme with a programmable hysteresis range, to detect the received BMC data from the transmitter appropriately.

In another embodiment, a digital control unit is configured to adjust TX impedance present on the CC line to match eye requirements based on data received from eye correction receiver.

In another embodiment, the TX impedance values are stored in a memory and are used for subsequent transmission of BMC data to correct eye.

In another embodiment, the BMC data transmitted in the transceiver is in conformity according to a as per a USB type-C PD specification.

Various objects, features, aspects, and advantages of the inventive subject matter will become more apparent from the following detailed description of preferred embodiments, along with the accompanying drawing figures in which like numerals represent like components.

BRIEF DESCRIPTION OF DRAWINGS

The accompanying drawings are included to provide further understanding of the present disclosure and are incorporated in and constitute a part of this specification. The drawings illustrate exemplary embodiments of the present disclosure and, together with the description, serve to explain the principles of the present disclosure. The diagrams are for illustration only, which thus is not a limitation of the present disclosure.

DETAILED DESCRIPTION

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

The present disclosure relates, in general, to data transmission through configurable channels in a USB type-C port. In particular, the present disclosure relates to transmission of data through configurable channels in a USB type-C port with slew rate control and eye correction.

In an aspect, the present disclosure provides a transceiver for transmission of data coded according to a Bi-phase Mark Coding (BMC) protocol through a configurable channel (CC) of a USB type-C port. The transceiver includes: a transmitter configured to receive the coded BMC data and transmit the coded BMC data through the CC line. The transmitter includes: a low dropout (LDO) regulator configured to receive a reference voltage (VREF) and generate a local programmable supply voltage; a delay control logic configured to receive the BMC data, and including a plurality of flipflops connected in series, wherein, output from each flipflop is delayed with respect to input received by the flipflop; and a transmitter driver configured to receive output from each flipflop of the delay control logic, the transmitter driver including a plurality of NMOS switches and a plurality of PMOS switches. The plurality of NMOS switches and the plurality of PMOS switches are operable on receipt of output from each flipflop of the delay control logic, and the plurality of NMOS switches and the plurality of PMOS switches are turned on with delays corresponding to output from each flipflop to generate a slew rate for the output of the transmitter driver, the output being BMC data with slew control. The transceiver includes an eye correction receiver configured to receive output from the transmitter driver of the transmitter. Output from the transmitter is sent from a first CC line and received at the eye correction receiver through a second CC line to provide eye control to the transmitted BMC data.

In another embodiment, the first CC line can be any of CC1 and CC2, and the second CC line can correspondingly be any of CC2 and CC1.

In another embodiment, the CC line selection for transmission happens through TX_CC_SEL control provided by digital control unit. The CC line selection for eye correction receiver happens through RX_CC_SEL control provided by the digital control unit.

In an exemplary embodiment, the output of the eye correction receiver is sampled by a digital control unit, which is configured to set the RES TRIM <0:23> that is used for slew and impedance control in the transmitter driver.

In an embodiment, the transmitter receives TX-EN and TX_CLK to be transmitted on the CC line from the digital control unit.

In another embodiment, upon assertion of TX_EN, output from each flipflop is such that there a delay with respect to input BMC data received by respective flipflops. In an exemplary embodiment, the delay is one clock cycle.

In another embodiment, upon de-assertion of TX_EN, output of each flipflop is set to 1 and 0. In another embodiment, the output is supplied to the transmitter driver where the plurality of NMOS switches and the plurality of PMOS switches are turned off, and the output data from the transmitter is in a high impedance (Hi-Z) state.

In another embodiment, the output from the transmitter is connected to CC pin through selection MUX in order to transmit data coded as per BMC protocol.

In another embodiment, the receiver is provided with a comparator-based scheme with a programmable hysteresis range, to detect the received BMC data from the transmitter appropriately.

In another embodiment, a digital control unit is configured to adjust TX impedance present on the CC line to match eye requirements based on data received from eye correction receiver.

In another embodiment, the TX impedance values are stored in a memory and are used for subsequent transmission of BMC data to correct eye.

In another embodiment, the BMC data transmitted in the transceiver is in conformity according to a as per a USB type-C PD specification.

Figure 1:
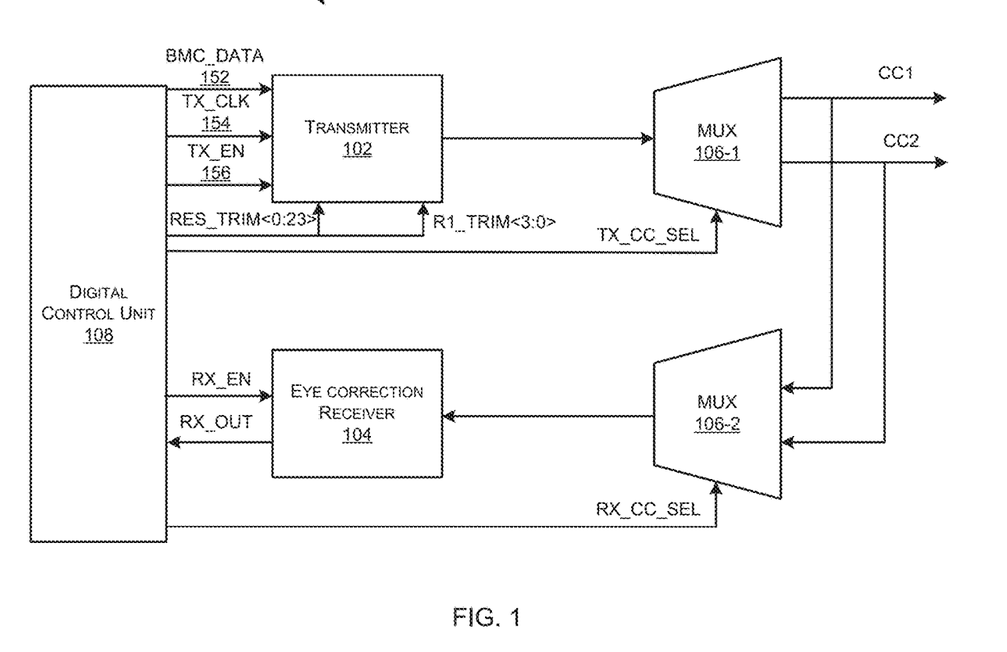
FIG. 1 illustrates an exemplary block diagram of a Bi-phase Mark Coding (BMC) transceiver, in accordance with an embodiment of the present disclosure.

FIG. 1 illustrates an exemplary block diagram of a Bi-phase Mark Coding (BMC) transceiver, in accordance with an embodiment of the present disclosure. The transceiver 100 includes a transmitter 102 that is adapted to transmit coded data according to BMC protocol to a receiver 104.

The transmitter 102 receives the BMC data 152 to be transmitted to the receiver 104, as well as TX-EN 154 and TX-CLK 156. The BMC data is encoded in a BMC encoder (not shown in figure), which is part of a digital control unit 108, and TX-EN 154 and TX-CLK 156 inputs are provided from the digital control unit 108. TX_EN 154 and TX_CLK 156 are used for operation of flipflops in a delay control logic (as illustrated in FIG. 2).

Typically, it is required that a transmitter transmits data with a control over slew rate and with a termination impedance of about 50 ohms in order for a receiver to receive the data without faults formed due to improper slew rate and eye faults. Output from the transmitter 102 is expected to have a minimum slew rate (rise/fall time) of about 300 ns, according to the USB Type-C PD specification.

The present disclosure provides a transmitter that is configured to transmit data coded according to the BMC protocol such that the receiver receives the data without faults.

Figure 2:
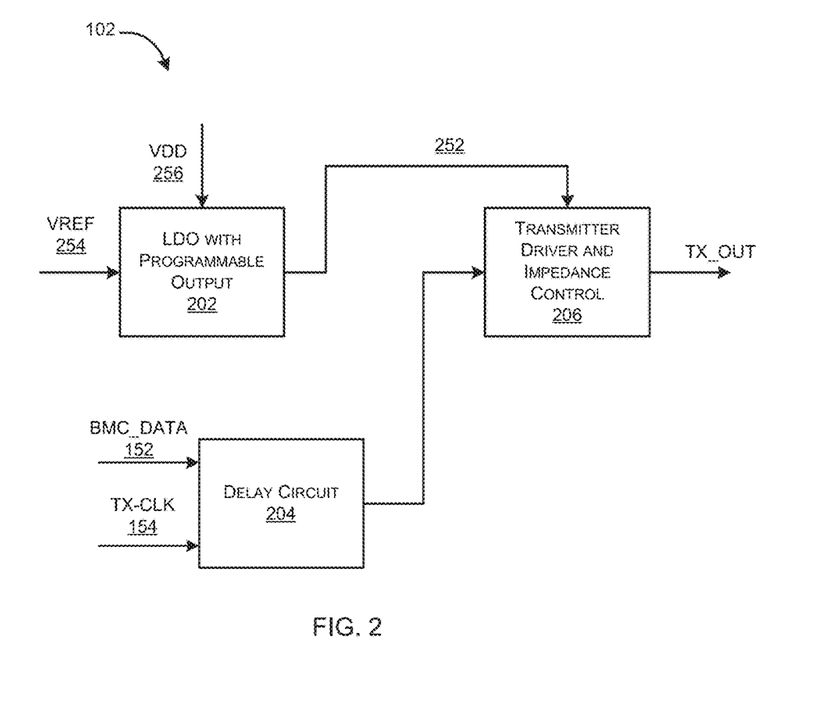
FIG. 2 illustrates an exemplary block diagram of a transmitter for transmitting data coded according to the BMC protocol, in accordance with an embodiment of the present disclosure.

FIG. 2 illustrates an exemplary block diagram of a transmitter for transmitting data coded according to the BMC protocol, in accordance with an embodiment of the present disclosure.

In an embodiment, the transmitter 102 includes a low dropout (LDO) regulator 202; a delay control logic 204 and a transmitter driver 206.

The LDO regulator 202 is configured to generate a local programmable supply voltage 252 on receipt of VREF 254 and VDD 256 voltages, the local programmable supply voltage 252 then being supplied to the transmitter driver 206. Output from the transmitter driver 206 is TX_OUT 258, which is transmitted to the eye correction receiver 104 through MUX 106-1 and MUX 106-2, based, respectively, on inputs TX_CC_SEL and RX_CC_SEL provided from the digital control unit 108.

Figure 3:
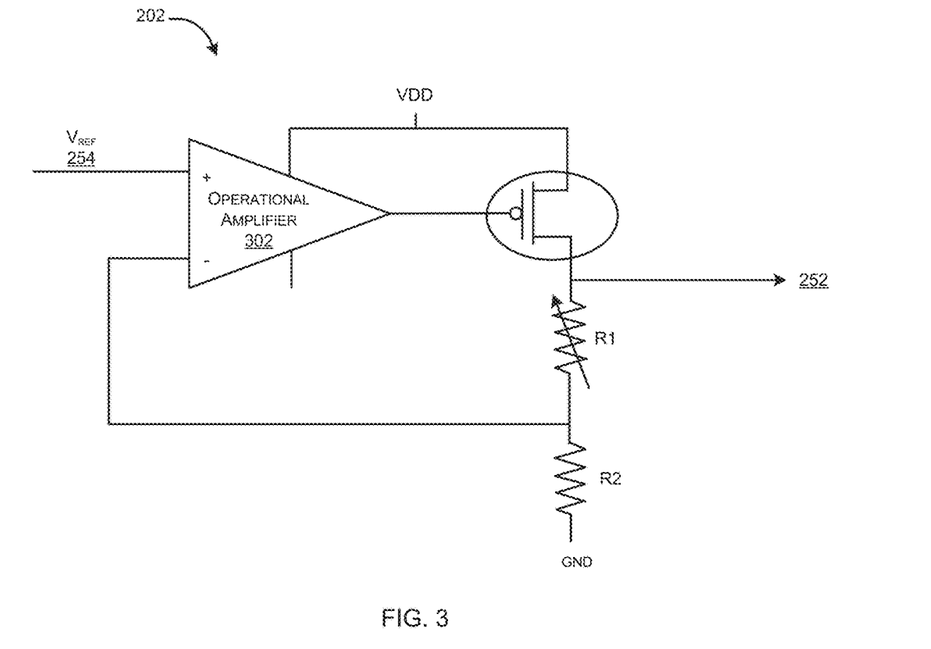
FIG. 3 illustrates an exemplary representation of an LDO regulator, in accordance with an embodiment of the present disclosure.

Here, VREF 254 and VDD 256 are voltages supplied from an external source. VREF 254 is used as a reference voltage, while VDD 256 represents a supply voltage. Based on the value of VREF 254 and R1 304 (as illustrated in FIG. 3), the local programmable supply 252 is maintained at a desired value. This occurs due to an internal feedback mechanism that, irrespective of changes in load current on the local programmable supply 252, VREF 254 is used as a reference to correct the output voltage to generate a fixed and stable local programmable supply 252. To change the value of the local programmable supply 252, the value of VREF 254 may be accordingly changed.

FIG. 3 illustrates an exemplary representation of an LDO regulator, in accordance with an embodiment of the present disclosure. The LDO regulator 202 includes an operational amplifier 302 which receives the VREF 254 and VDD 256 voltages. The LDO regulator 202, as output, generates the local programmable supply voltage 252, which is supplied to the transmitter driver 206.

In an exemplary embodiment, the local programmable supply voltage 252 can be in the range of 1.025V to 1.2V with a 12.5 mV step voltage. The programmable supply voltage 252 can be regulated by varying the resistance R1 304, through a digital control unit 108, which provides R1_TRIM. The R1_TRIM signal is supplied from the digital control unit 108.

In another embodiment, the value of the local programmable supply 252 controls the range of values obtained at the output TX_OUT 258.

Referring to FIG. 2, in an embodiment, the delay control logic 204 includes a series of D flipflops which receive the BMC data 152, and which are adapted to, upon assertion of TX_EN 154, to create a cascaded delay in output of each flipflop, the delay being equal to one clock cycle (TX_CLK) 156.

Figure 4:
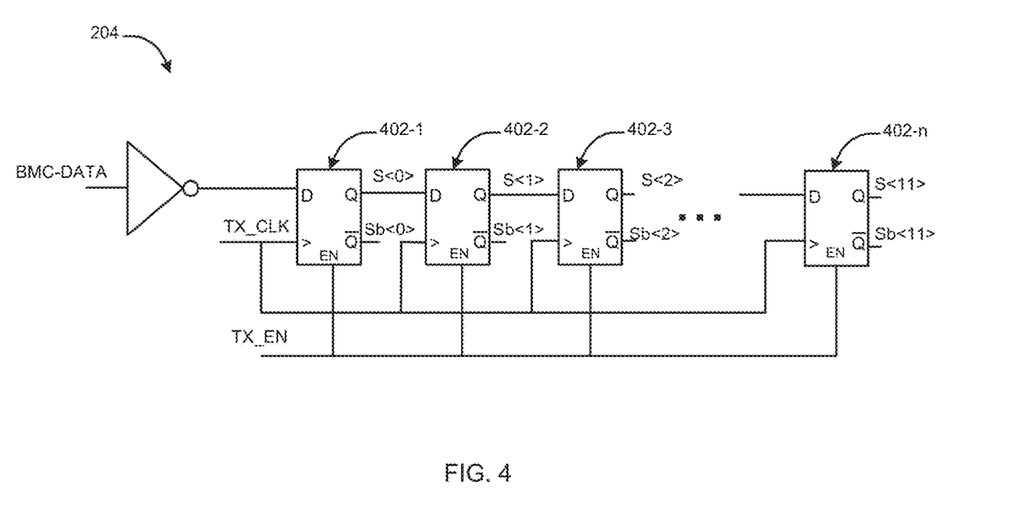
FIG. 4 illustrates an exemplary representation of the delay control logic, in accordance with an embodiment of the present disclosure.

FIG. 4 illustrates an exemplary representation of the delay control logic, in accordance with an embodiment of the present disclosure. The delay control logic 204 includes the series of D flipflops (402-1, 402-2 ... 402-N; herein referred individually or collectively as 402), which receive the BMC data 152. In an exemplary embodiment, the number of flipflops is 12 (402-1, 402-2 ... 402-12).

When TX_EN 154 is asserted, output (both Q and QB) from each flipflop 402 is such that there is one clock cycle (TX_CLK) delay with respect to input received by respective flipflops 402. Output from each flipflop 402 is, in turn, used to operate NMOS and PMOS switches of the transmitter driver 206 to control the rise and fall time of output data from the transmitter 102.

When TX_EN is de-asserted, output of each flipflop 402 is set to 1 for Q and 0 for QB, which will turn off both NMOS and PMOS switches of the transmitter driver 206, and the output data from the transmitter 102 will be in a high impedance (Hi-Z) state.

The delay control logic 204 controls the slew rate of the transmitter 102. In order to maintain timing, each transmitter arm is turned on, one at a time, during rise, and turned off, one at a time, during fall. This is achieved by having a TX_CLK 156 run through the flipflops 402. With every clock, the next flipflop 402 goes high, and this is used to turn on a transmitter arm. By varying the number of flipflops 402 asserted, delay can be controlled, thereby controlling slew rate of the BMC data.

In an exemplary embodiment, the TX_CLK 156, a high frequency clock, is provided from the digital control unit 108 such that the fall and rise times may be controlled as per the USB type-C PD specifications to achieve slew rate control. The TX_CLK frequency may be varied to meet USB PD eye rise and fall times specification.

Referring to FIG. 2, in an embodiment, the transmitter driver 206 is provided with an impedance control and receives outputs from both the LDO regulator 202 and the delay control circuit 204.

Figure 5:
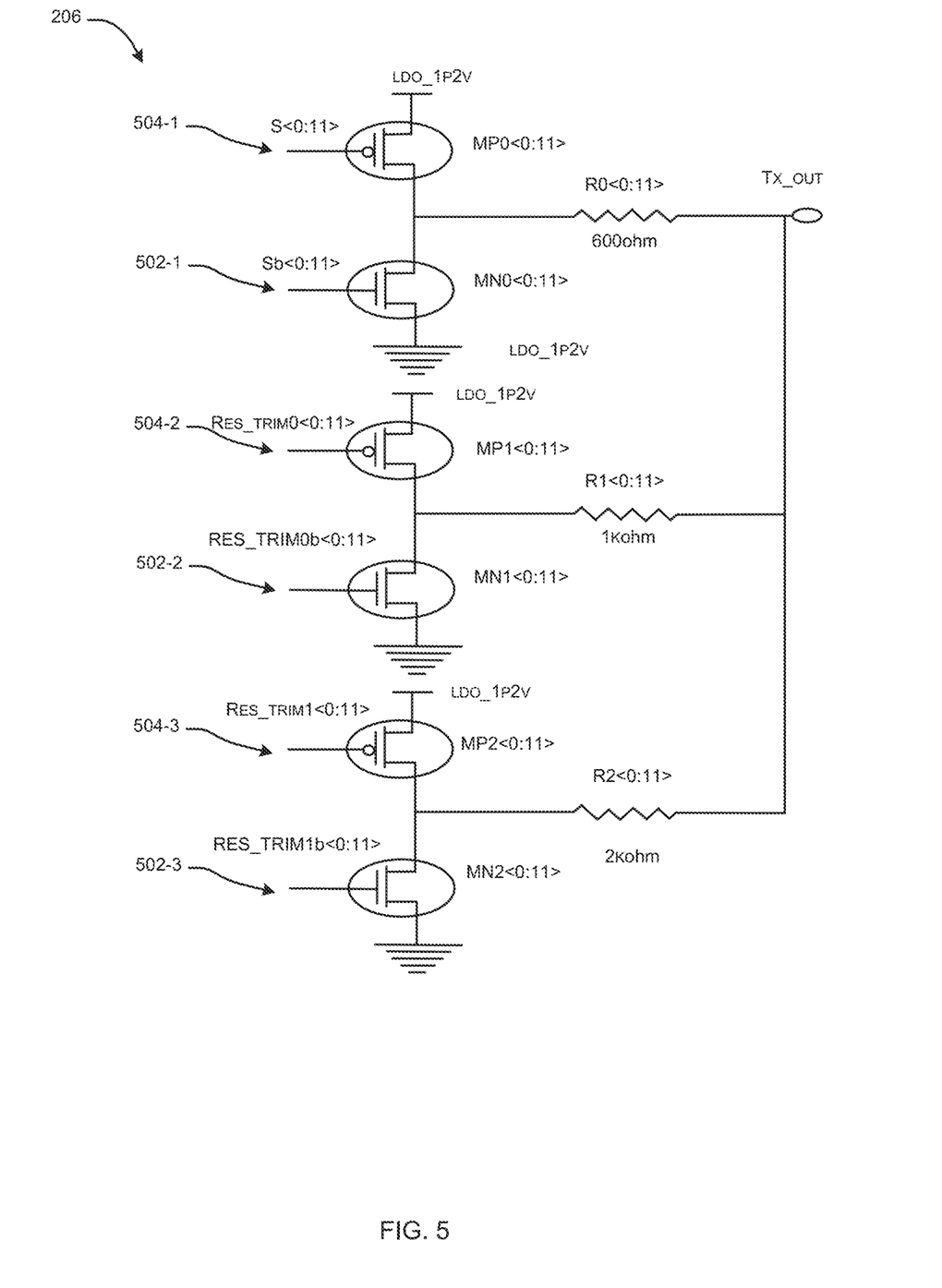
FIG. 5 illustrates an exemplary representation of the transmitter driver, in accordance with an embodiment of the present disclosure.

FIG. 5 illustrates an exemplary representation of the transmitter driver, in accordance with an embodiment of the present disclosure.

In an embodiment, the transmitter driver 206 is provided with NMOS switches (502-1, 502-2, 502-3; herein referred individually or collectively as 502) and PMOS switches (504-1, 504-2, 504-3; herein referred individually or collectively as 504) that are operated on receipt of outputs from the flipflops 402 of the delay control logic 204.

The termination impedance throughout BMC data 152 transmission can be trimmed and controlled by the NMOS switches 502 and the PMOS switches 504 and resistors paths that are turned on during transmission of BMC data 152.

Referring to FIG. 2, in an embodiment, the output of the transmitter driver 206 is coupled to a configurable channel (CC) pin.

Figure 6:
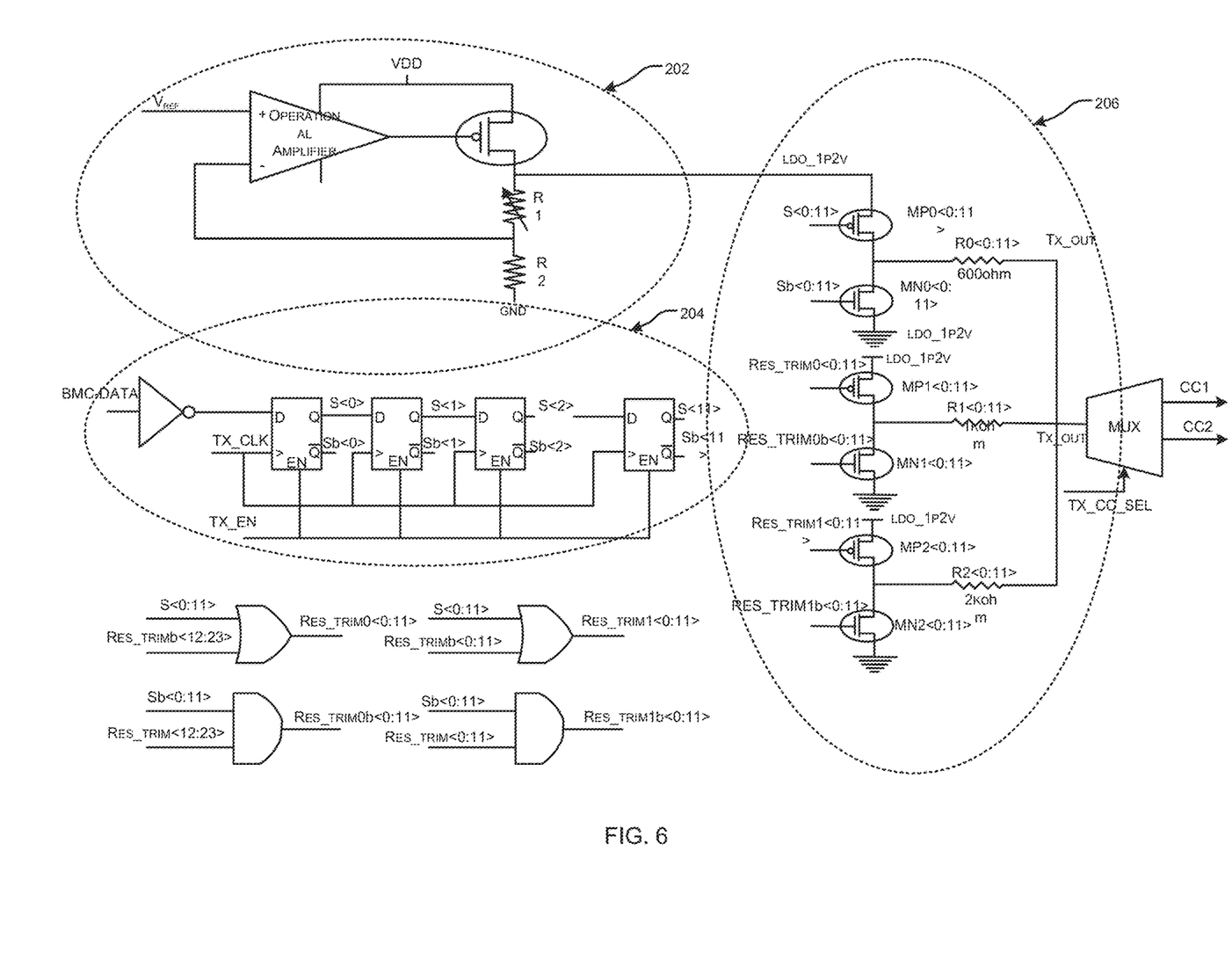
FIG. 6 illustrates an exemplary representation of the transmitter for transmitting data coded according to the BMC protocol, in accordance with an embodiment of the present disclosure.

FIG. 6 illustrates an exemplary representation of the transmitter for transmitting data coded according to the BMC protocol, in accordance with an embodiment of the present disclosure. In an embodiment, the transmitter 102 includes the low dropout (LDO) regulator 202; the delay control logic 204; and the transmitter driver 206. The output of the transmitter driver 206 is coupled to a configurable channel (CC) pin.

FIG. 6 illustrates an analogue block for putting on the CC line. The BMC data is coded in the digital control unit 108, which runs at two times the UI clock frequency to transmit 1 and 0 on the CC line. The digital control unit 108 also receives UI clock input. The UI clock frequency can be in the range of about 270-300 KHz.

Figure 7:
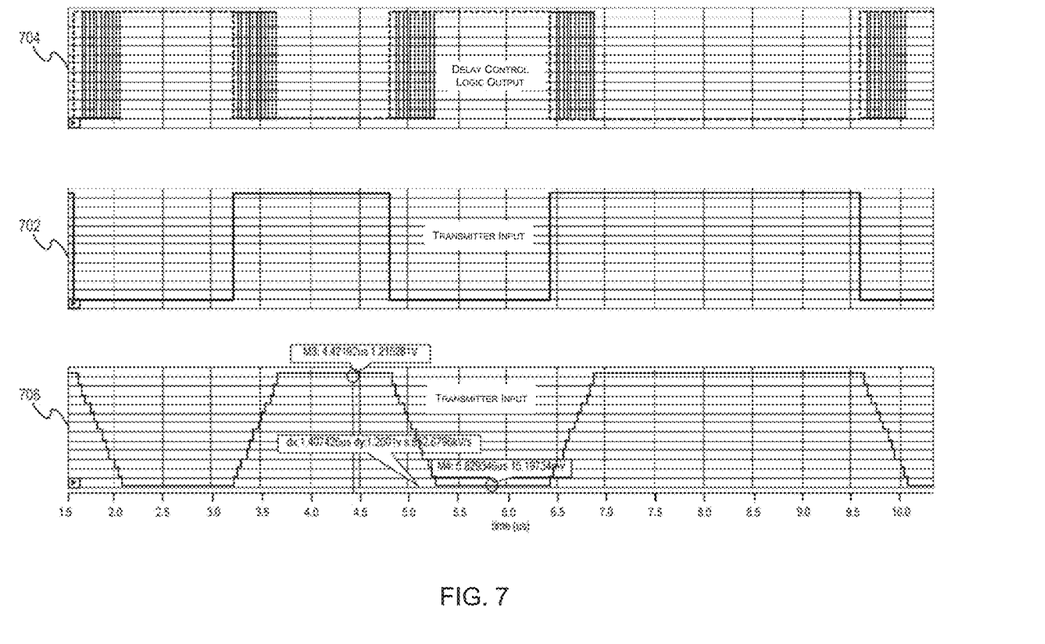
FIG. 7 illustrates an exemplary output from the transmitter, in accordance with an embodiment of the present disclosure.

FIG. 7 illustrates an exemplary output from the transmitter, in accordance with an embodiment of the present disclosure. The input 702 received at the transmitter 102 is provided to the delay control logic 204, which generates a sequence of delays (as illustrated by plot 704), and the output 706 from the transmitter 102 is provided with slew control as per USB type-C PD specifications.

Referring to FIG. 1, output from the transmitter 102 is connected to CC pin through selection MUX (106-1, 106-2) in order to transmit data coded as per BMC protocol.

Figure 8:
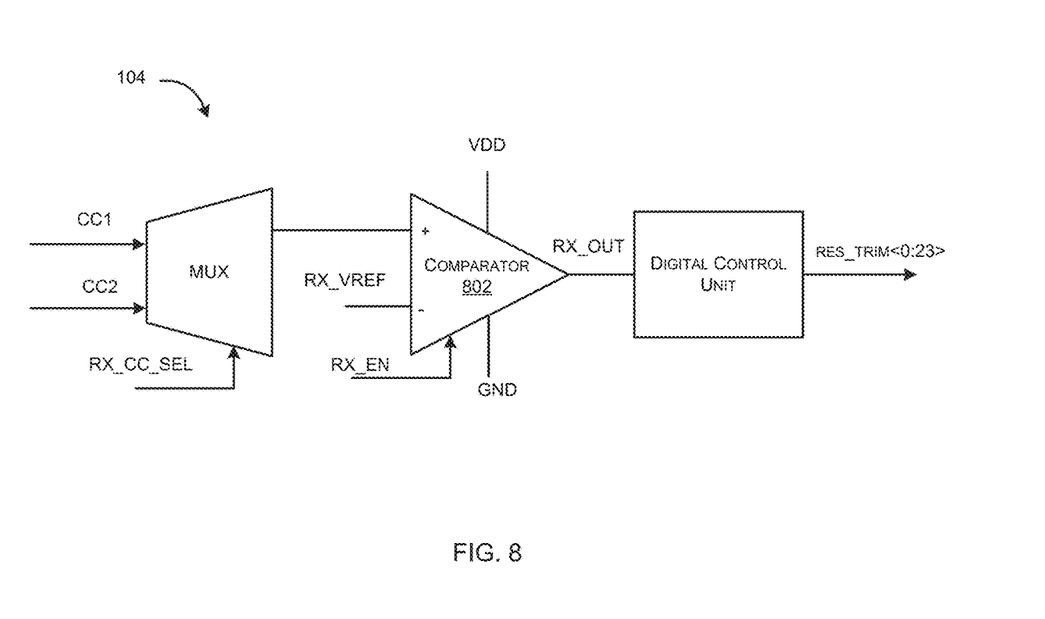
FIG. 8 illustrates an exemplary representation of the eye correction receiver, in accordance with an embodiment of the present disclosure.

FIG. 8 illustrates an exemplary representation of the eye correction receiver, in accordance with an embodiment of the present disclosure.

In an embodiment, the eye correction receiver 104 has a comparator-based scheme with a programmable hysteresis range, which detects the received BMC data from the transmitter 102 appropriately.

A reference voltage generation block (not shown in figure) is adapted to provide VREF 254 voltage. In an exemplary embodiment, the range of VREF voltage may be from 600 mV to 1.2V with a variation of ±5%.

The eye correction receiver 104 is designed to have a comparator input with reference voltage which is in the range of 100 mV to 1.2V with a 50 mV step. The eye correction receiver 104 traces the transmitter eye reference masks by comparing against known eye masks from USB PD specification. The eye correction receiver 104 also adjusts the reference trims for impedance termination on the transmitter side 102 depending on the output of eye correction receiver comparator 802. The comparator references are changed in a time phased manner by the digital control unit 108, which maintains the voltage and time values required to meet USB PD specification (refer FIG. 9C). The eye mask specifications from the USB PD specification is internally stored by digital control unit 108 and used to compare with the data reference obtained from the eye correction receiver.

In another embodiment, transmitter eye correction can be achieved by sending output from the transmitter 102 from a first C1 line to the input of the eye correction receiver 104 from a second CC line during a test phase.

In another embodiment, the first CC line can be any of CC1 and CC2, and the second CC line can correspondingly be any of CC2 and CC1. The selection of the CC line is based on TX_CC_SEL and RX_CC_SEL signals provided from the digital control unit 108.

RES_TRIM0 and RES_TRIM1 (12 bits each) bits are controlled by the digital control unit 108 and it controls slew rate of transmitter depending on the output generated from the receiver 104. The digital control unit 108 generates the RES TRIM<0:23> signals which are used as is and in inverted fashion. RES_TRIMb is inverted version of RES_TRIM.

Figure 9A:
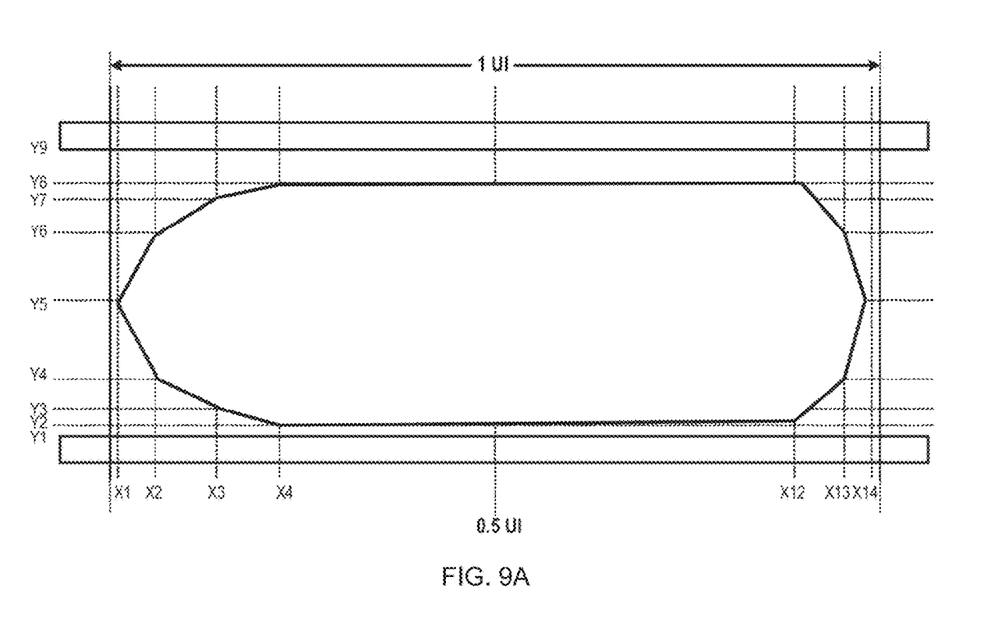
FIGS. 9A and 9B illustrate exemplary representations of BMC TX 0 eye mask and BMC TX 1 eye mask respectively, in accordance with an embodiment of the present disclosure.
Figure 9B:
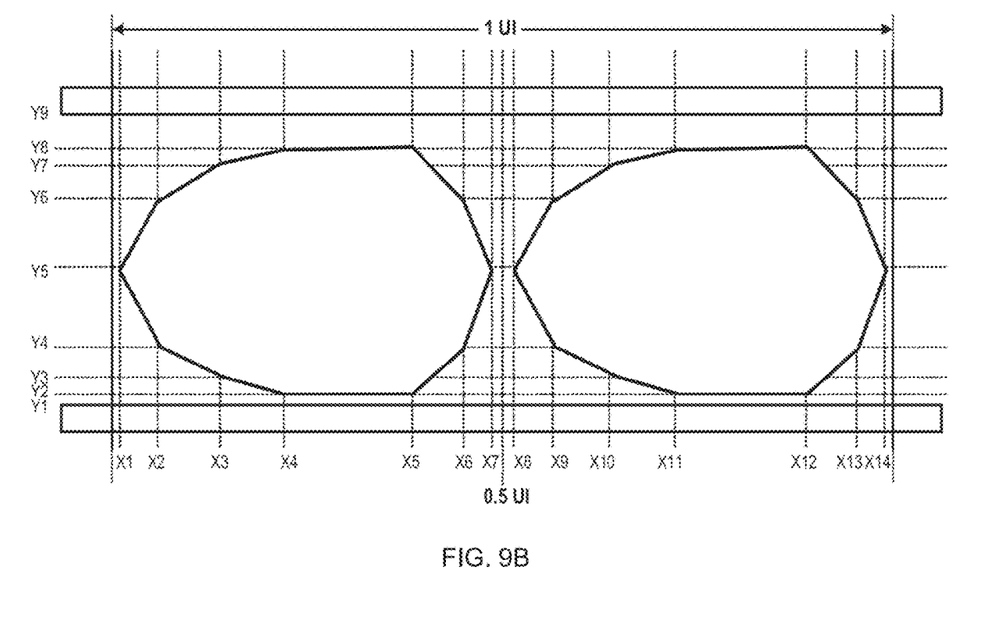

FIGS. 9A and 9B illustrate exemplary representations of BMC TX 0 eye mask and BMC TX 1 eye mask respectively, in accordance with an embodiment of the present disclosure.

Figure 9C:
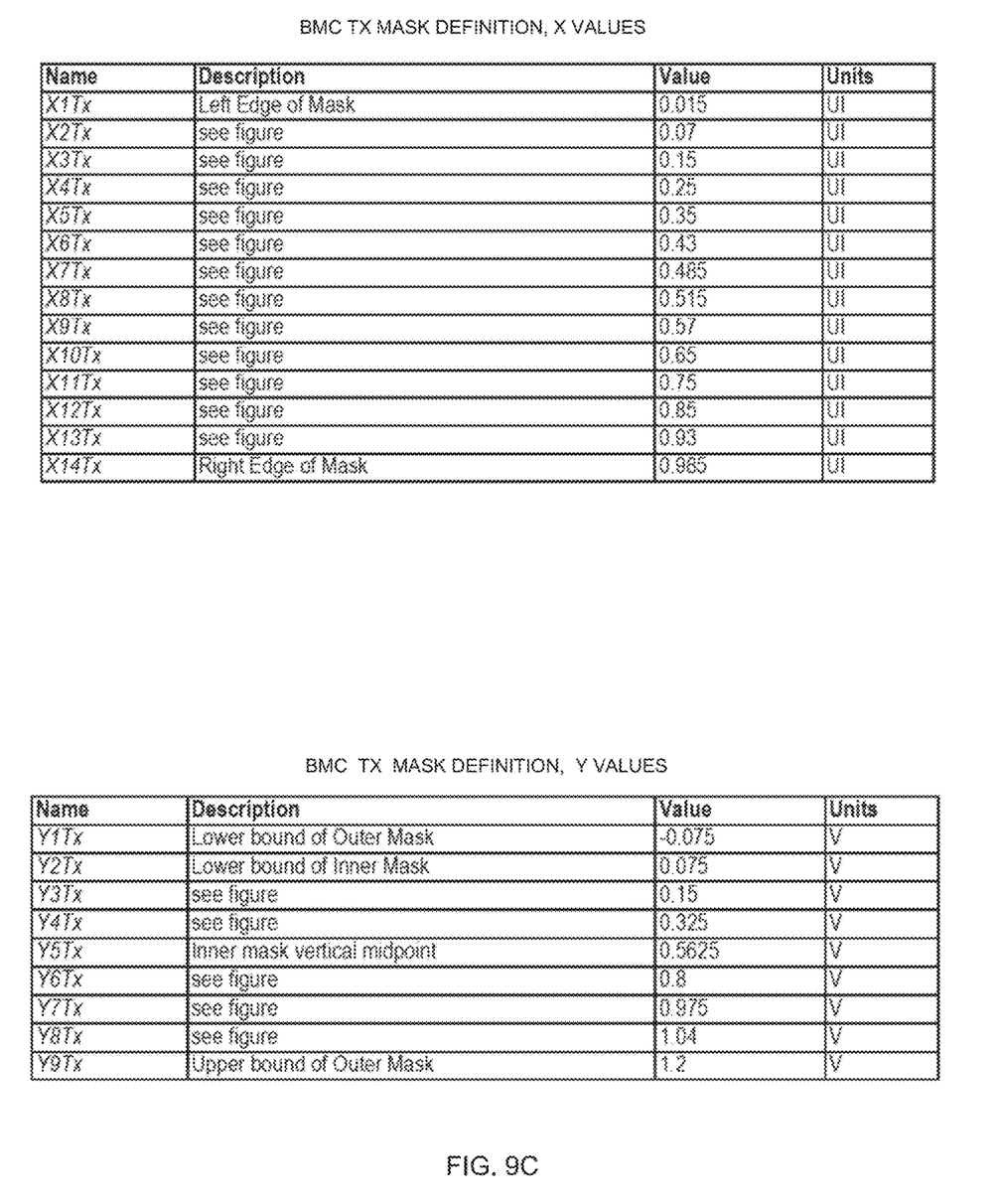
FIG. 9C illustrates exemplary eye mask specification according to USB PD specifications, in accordance with an embodiment of the present disclosure.

FIG. 9C illustrates exemplary eye mask specification according to USB PD specifications, in accordance with an embodiment of the present disclosure.

Figure 9D:
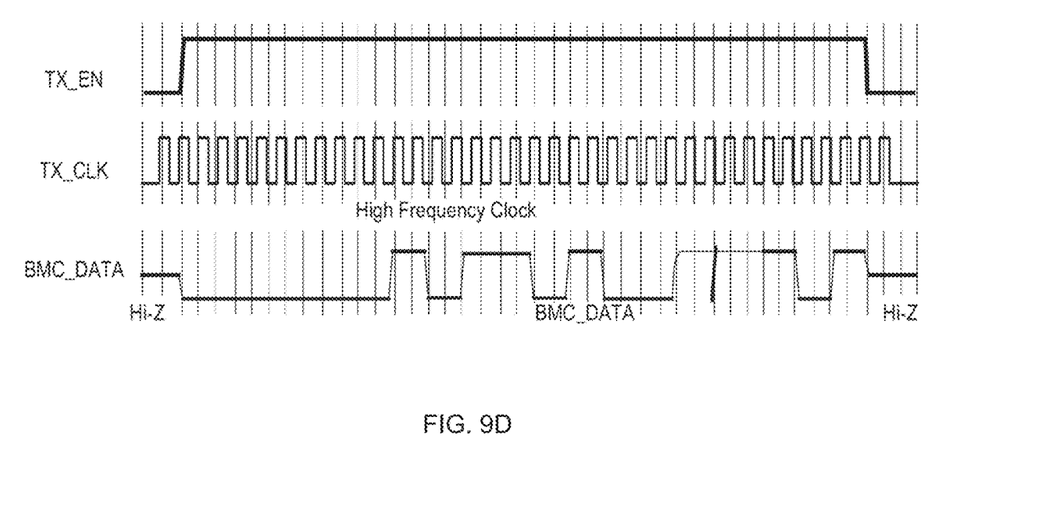
FIG. 9D illustrates an exemplary representation of a timing diagram showing variation in timing of signals from the digital control unit, in accordance with an embodiment of the present disclosure.

FIG. 9D illustrates an exemplary representation of a timing diagram showing variation in timing of signals from the digital control unit, in accordance with an embodiment of the present disclosure. Signals TX_EN 154 and TX_CLK 156 are supplied from the digital control unit 108, along with encoded BMC data 152.

Figure 10:
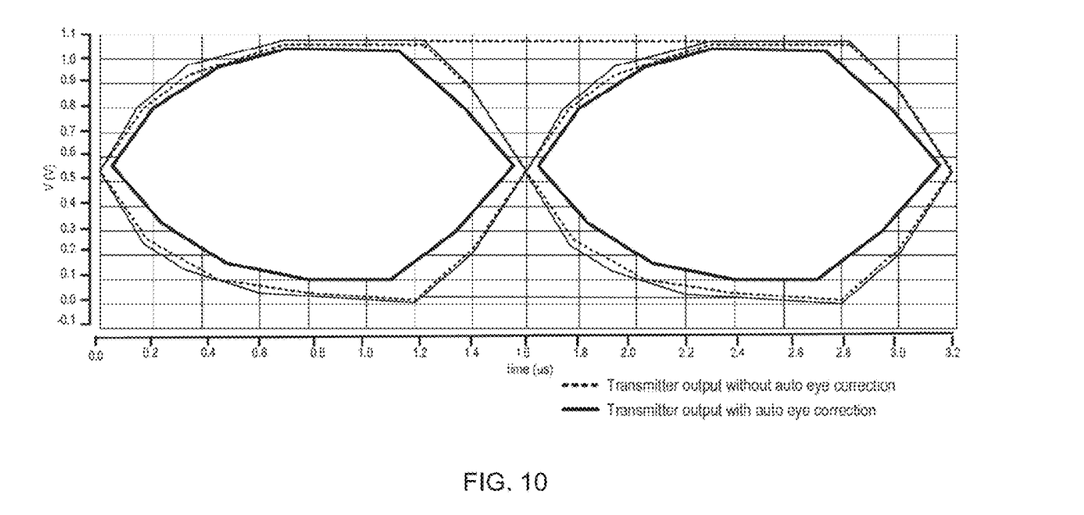
FIG. 10 illustrates an exemplary representation of transmitter eye diagram with eye correction, in accordance with an embodiment of the present disclosure.

FIG. 10 illustrates an exemplary representation of transmitter eye diagram with eye correction, in accordance with an embodiment of the present disclosure.

Eye correction feature helps in manipulating the uncertainty of parasitic parameters after post silicon, to compensate for any silicon process effects. It also makes the eye diagram obtained have more margin and hence, less susceptibility to noise.

The digital control unit is configured to look at the input BMC receiver (RX) data and tries to adjust the TX impedance present on the CC line to match the eye requirements according to the USB type-C PD specification. The eye correction is done during the preamble transmission stage so that the data can be transmitted with a desired slew rate. The digital control unit runs at two times the UI clock frequency to transmit BMC coded '0' and '1'. Once the settings for impedance are known during the eye correction phase, the settings are stored in a memory device (not shown in figure) such as an Non-Volatile memory (NVM)/Flash and the same are used for subsequent transmissions.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

The present disclosure provides a means to faultlessly transmit BMC data through configurable channel of a USB type-C port.

The present disclosure provides a means to transmit BMC data with slew control.

The present disclosure provides a means for means to transmit BMC data with eye correction.

The present disclosure provides a means for means to transmit BMC data according to USB type-C PD specification.

We claim:

1. A transceiver for transmission of data coded according to a Bi-phase Mark Coding (BMC) protocol through a configurable channel (CC) of a USB type-C port, said transceiver comprising:
   a transmitter configured to receive coded BMC data and transmit the coded BMC data through the CC, the transmitter comprising:
      a low dropout (LDO) regulator configured to receive a reference voltage (VREF) and generate a local programmable supply voltage;
      a delay control logic configured to receive the BMC data, and comprising a plurality of flipflops connected in series, wherein, an output from each of the plurality of flipflops is delayed with respect to an input received by said each of the plurality of flipflops; and
      a transmitter driver configured to receive the output from said each of the plurality of flipflops of the delay control logic, the transmitter driver comprising a plurality of NMOS switches and a plurality of PMOS switches,
   wherein the plurality of NMOS switches and the plurality of PMOS switches are operable on receipt of the output from said each of the plurality of flipflops of the delay control logic, and
   wherein, the plurality of NMOS switches and the plurality of PMOS switches are turned on with delays corresponding to the output from said each of the plurality of flipflops to generate a slew rate for output of the transmitter driver, the output of the transmitter driver being BMC data with slew control; and
   an eye correction receiver configured to receive the output from the transmitter driver, wherein, the output from the transmitter driver is sent from a first CC line and received at the eye correction receiver through a second CC line to provide eye control to the transmitted BMC data.

2. The transceiver as claimed in claim 1, wherein the first CC line is one of a configurable channel 1 (CC1) and a configurable channel 2 (CC2), and the second CC line is the other one of the CC1 and the CC2, and wherein CC line selection for transmission is facilitated through control signal TX_CC_SEL provided by a digital control unit, and CC line selection for reception by the eye correction receiver is facilitated through control signal RX_CC_SEL provided by the digital control unit.

3. The transceiver as claimed in claim 1, wherein the transmitter receives signals TX_EN and TX_CLK from the digital control unit.

4. The transceiver as claimed in claim 1, wherein, upon assertion of a signal TX_EN, the output from said each of the plurality of flipflops is such that there a delay with respect to input BMC data received by respective ones of the plurality of flipflops.

5. The transceiver as claimed in claim 4, wherein the delay is one clock cycle.

6. The transceiver as claimed in claim 1, wherein, upon de-assertion of a signal TX_EN, the output of said each of the plurality of flipflops is set to 1 and 0.

7. The transceiver as claimed in claim 6, wherein the output of said each of the plurality of flipflops is supplied to the transmitter driver while the plurality of NMOS switches and the plurality of PMOS switches are turned off, and the output data from the transmitter is in a high impedance (Hi-Z) state.

8. The transceiver as claimed in claim 1, wherein the output from the transmitter driver is connected to a CC pin through a selection multiplexer to facilitate transmission of data coded as per the BMC protocol.

9. The transceiver as claimed in claim 1, wherein the eye correction receiver comprises a comparator with a programmable hysteresis range, to detect received BMC data from the transmitter.

10. The transceiver as claimed in claim 1, wherein a transmission (TX) impedance present on the CC is adjusted to match eye requirements based on data received from the eye correction receiver.

11. The transceiver as claimed in claim 10, wherein TX impedance values are stored in a memory and are used for subsequent transmission of the BMC data to correct an eye of the BMC data.

12. The transceiver as claimed in claim 1, wherein the BMC data transmitted in the transceiver is in conformity according to a USB type-C Power Delivery (PD) specification.

* * * * *